(12) United States Patent
Lai et al.

(10) Patent No.: US 9,888,578 B2
(45) Date of Patent: Feb. 6, 2018

(54) METHOD OF MAKING HIGHLY FLEXIBLE AND CONDUCTIVE PRINTED GRAPHENE-BASED LAMINATE FOR WIRELESS WEARABLE COMMUNICATIONS

(71) Applicants: Chung-Ping Lai, Zhubei (TW); Kuo-Hsin Chang, Dalin Township, Chiayi County (TW); Jia-Cing Chen, Tainan (TW)

(72) Inventors: Chung-Ping Lai, Zhubei (TW); Kuo-Hsin Chang, Dalin Township, Chiayi County (TW); Jia-Cing Chen, Tainan (TW)

( * ) Notice: Subject to any disclaimer, the term of this patent is extended or adjusted under 35 U.S.C. 154(b) by 0 days.

(21) Appl. No.: 14/952,942

(22) Filed: Nov. 26, 2015

(65) Prior Publication Data
US 2017/0156215 A1    Jun. 1, 2017

(51) Int. Cl.
H05K 3/00        (2006.01)
H05K 3/22        (2006.01)

(52) U.S. Cl.
CPC ......... H05K 3/0058 (2013.01); H05K 3/0064 (2013.01); H05K 3/227 (2013.01)

(58) Field of Classification Search
CPC .................................................. H05K 3/0058
See application file for complete search history.

(56) References Cited

U.S. PATENT DOCUMENTS

| | | | | |
|---|---|---|---|---|
| 8,454,859 B2 * | 6/2013 | Lowenthal | ............. | C09D 11/52 252/514 |
| 2013/0102084 A1 * | 4/2013 | Loh | ........................ | B01J 21/185 436/94 |
| 2014/0190676 A1 * | 7/2014 | Zhamu | .................... | F28F 21/02 165/185 |

* cited by examiner

Primary Examiner — Daniel H Lee

(57) ABSTRACT

A printed graphene-based laminate for wireless wearable communications can be processed at low temperature so that it is compatible with heat-sensitive flexible materials like papers and textiles. The printed graphene-based laminate is of high conductivity, high flexibility, light weight and low cost, making it perfect candidate for wireless wearable devices. As a proof of concept, printed graphene-based laminate enabled transmission lines (TLs) and antennas were designed, fabricated and characterized. To explore its potentials in wearable communications applications, mechanically flexible transmission lines and antennas under various bended cases were experimentally studied. The measurement results demonstrate that the printed graphene laminate can be used for RF signal transmitting, radiating and receiving, which represents some of the essential functionalities of RF signal processing in wireless wearable communications systems. This work brings a step closer the prospect to implement all graphene enabled wireless wearable communications systems in the near future.

9 Claims, 3 Drawing Sheets

METHOD OF MAKING HIGHLY FLEXIBLE AND CONDUCTIVE PRINTED GRAPHENE-BASED LAMINATE FOR WIRELESS WEARABLE COMMUNICATIONS

FIELD OF THE INVENTION

The present invention relates to a method of making a printed graphene-based laminate for wireless wearable communications. The graphene-based laminate is processed at low temperature so that it is compatible with heat-sensitive flexible materials like papers, plastic film and textiles.

BACKGROUND OF THE INVENTION

Wireless wearable communications are fields of increasing research interest due to the numerous potentials offered in areas such as healthcare and fitness monitoring, mobile network/internet, smart skin and functional clothes to name a few. Radio frequency (RF) transceiver is a basic building block in any communications system, which receives RF signal and converts it to lower intermediate frequency (IF) so that the signal can be readily for analog to digital conversion (ADC) and digital signal process (DSP). A RF transceiver includes passive components such as antennas, transmission lines (TLs) and impedance matching networks and active circuits such as low-noise amplifier (LNA), frequency mixer and local oscillator to name a few. Conventionally, a RF transceiver is mainly fabricated with PCB (printed circuit board) assembly technology, which poses a big challenge in integration with flexible substrates like papers and textiles. To tackle this, researchers have proposed techniques of coating/plating metal on textile yarns, dyeing carbon nanotube on textile then sputtering with Ag/Au particles to make wearable antennas. However, these approaches, even though the metals were deposited on textile substrates, the fabrication procedures and materials used were complex and expensive, not suitable for mass deployment for low cost wireless wearable applications.

Graphene, single layer of carbon atoms arranged in a hexagonal lattice, is a very promising material for wireless wearable communications applications owing to its unique electronic and physical properties. To date, researchers have intensively explored the applications of graphene to make active devices such as transistors and diodes. A quaternary digital modulator was achieved using two graphene transistors. Amplifiers at RF bands were demonstrated experimentally with graphene field-effect transistors. Other active devices that are essential in a RF transceivers such as frequency mixer and oscillator were also demonstrated. More recently monolithic graphene RF receiver integrated circuit (IC) performing signal amplification, filtering and down-conversion has also been reported.

However, even though profound progress has been made in graphene active devices, the pace of developing graphene passive RF components has far lagged behind. This is because, in spite of graphene's high conductivity, both exfoliated and CVD (chemical vapor deposition) graphene sheets have very high surface resistance, hindering their applications in RF passive components. However, recent development of graphene conductive ink has brought the possibility along with its superiority in high conductivity, mechanical flexibility, light weight and low cost. Preparation of graphene conductive inks can be generally categorized into two groups. One is binder-free technique which disperses the graphene directly in solvents such as N-Methyl-2-pyrrolidone or Dimethylformamide (NMP/DMF) without adding any binder, whereas the other uses binders like ethyl cellulose (EC). Even though the latter technique can offer higher conductivity, it requires high-temperature thermal annealing, making it incompatible with heat-sensitive substrates like papers and textiles. On the other hand, binder-free technique is compatible with heat-sensitive substrates thanks to its low temperature annealing, however much further improvement of ink conductivity is required for RF applications.

The present invention has arisen to mitigate and/or obviate the afore-described disadvantages.

SUMMARY OF THE INVENTION

The primary objective of the present invention is to provide a printed graphene-based laminate for wireless wearable communications which is not only compatible with heat-sensitive substrates like papers, plastic film and textiles, but also offers high enough conductivity and mechanical flexibility for wireless wearable communications applications.

By comparison, the achieved conductivity from this technique reaches $4.3 \times 10^4$ S/m, which is almost twice the conductivity of chemical rGO ($2.5 \times 10^4$ S/m) from previously reported RGO (reduced graphene oxide) with binder and 10 times higher than that from binder-free method. This highly conductive printed graphene laminate is further utilized to construct transmission lines and antennas on a flexible substrate such as paper, plastic film and textiles which can reach high conductivity, good adhesion, and great flexibility simultaneously, that other binder-contained graphene inks or methods fail to meet. The performances of these components, especially under different bending cases, are experimentally examined. The results demonstrate that RF passive components made of printed graphene-based laminate have desired property and quality for wireless wearable communications applications.

To obtain above objective, a method of making a printed graphene-based laminate for wireless wearable communications provided by the present invention contain steps of:

A) coating binder-free graphene-based conductive ink on a substrate by printing techniques in any one of screen printing, inkjet printing, and spray printing manners;

B). drying the binder-free graphene-based conductive ink in an oven at 60° C.-200° C. so as to form a porous conductive layer on the substrate;

C). compression the porous conductive layer at the compression ratio of 50% to 90% by using a compression roller.

Preferably, after the step of (B), a porous conductive layer filled with other fillers forms on the substrate.

Preferably, a paper, plastic film or textile is used as the substrate, and the binder-free graphene-based conductive ink is printed on the substrate.

Preferably, a paper, plastic film or textiles is used as the substrate, and the binder-free graphene-based conductive ink is printed on the substrate.

BRIEF DESCRIPTION OF THE DRAWINGS

FIGS. 4(a) to 4(d) are schematic views illustrating printed graphene laminate enabled antenna bended on cylinders with various radii, wherein FIG. 4(a) shows un-bended, FIG. 4(b) shows bended with r=5.0 cm, FIG. 4(c) shows bended with r=3.5 cm and FIG. 4(d) shows bended with r=2.5 cm.

FIGS. 5(a) and 5(b) are schematic views illustrating measured results of the printed graphene laminate enabled antenna bended on cylinders with different radii, as shown in FIG. 4; Accordingly, curves (a)-(d) correspond to un-bend, bended with radius of 5.0 cm, 3.5 cm and 2.5 cm, respectively, wherein FIG. 5(a) shows reflection coefficients and realized gains and FIG. 5(b) shows radiation patterns at 1.97 GHz.

FIGS. 6(a) and 6(b) are schematic views illustrating measurement of transmission between two on-body antennas made of printed graphene-based laminate, wherein FIG. 6(a) shows measurement setting of the wearable antennas on mannequin and FIG. 6(b) shows transmission between two antennas attached on hands of mannequin with 0.5 m separation.

DETAILED DESCRIPTION OF THE PREFERRED EMBODIMENTS

Figure 1:
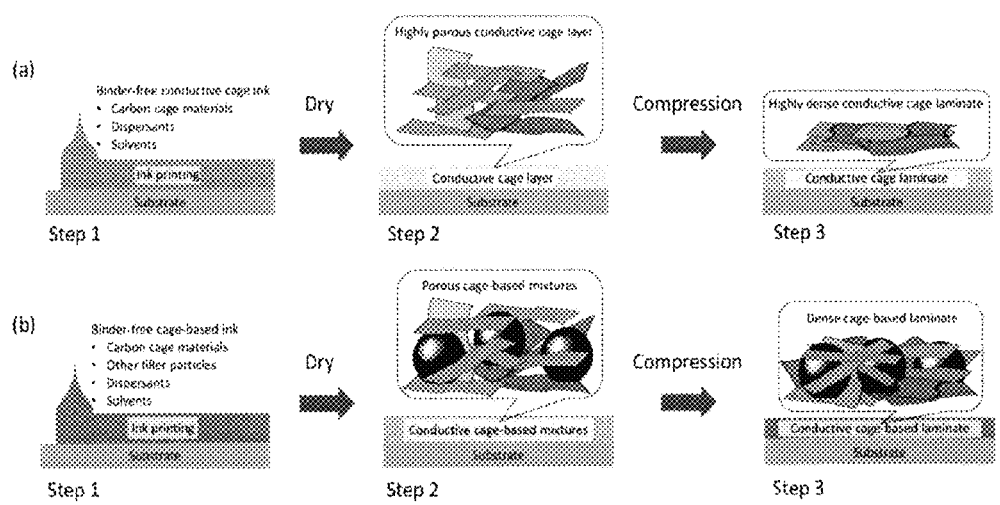
FIGS. 1(a) and 1(b) are schematic illustrating preparation of binder-free conductive cage-based laminate for printed antenna according to a preferred embodiment of the present invention.

A method of making a printed graphene laminate for wireless wearable communications according to a preferred embodiment of the present invention comprises steps of:

A). coating binder-free graphene-based conductive ink on a substrate by printing techniques, such as screen printing, inkjet printing, and spray printing, as shown in the step 1 of FIGS. 1(a), (b);

B). drying the binder-free graphene-based conductive ink in an oven at 60-200° C. to form a porous layer on the surface of substrate, as shown in the step 2 of FIGS. 1(a), (b); and C). compressing the porous layer by a compression roller at the compression ratio of 50%~90%. So a graphene-based laminate is obtained as shown in the step 3 of FIGS. 1(a), (b).

In FIG. 1(a), binder-free graphene-based conductive ink is printed on substrate and then a macro-porous layer is formed after drying, wherein a dense graphene-based laminate is obtained after compression under high compression ratio. In FIG. 1(b), conductive graphene flake is used as conductive cage to trap other filler powders, such as other carbons, conductive oxide particles, and metal powders. So other fillers are mixed into the binder-free graphene-based conductive ink. The mixture ink is printed on substrate and after drying other filler powders were trapped within graphene-based porous layer, wherein a dense graphene-based mixture laminate is obtained after compression under high compression ratio.

Due to 2D layer structure of graphene, compression can enhance the van der Waals force between graphene-graphene, and graphene-substrate, which in macroscopic view increases the adhesion of conductive fillers within graphene porous structure and the adhesion of laminate-to-substrate interface.

In this invention, other fillers were trapped and linked by the porous conductive graphene layer unlike the other cases of insulator-typed binders. The absence of insulator-typed polymer binder makes ink more conductive. Therefore, this idea leads to binder-free graphene-based laminate, which greatly enhances the conductivity due to the absence of insulate binder. Graphene flake in our invention is proposed as not only conductive material but also an efficient porous cage to catch other fillers. So a combination of graphene nanoflake, other conductive filler, and a compressing rolling under high compression ratio is requested to reach the application of wireless wearable communications.

Therefore, printed graphene laminate are is applied to flexible transmission lines. TLs are basic structures designated to carry signal current and are essential for RF circuits, or indeed any electronic circuits. Some TL structures made of graphene-based laminate have been designed and characterized to investigate their feasibility for RF signal transmission.

Figure 2A:
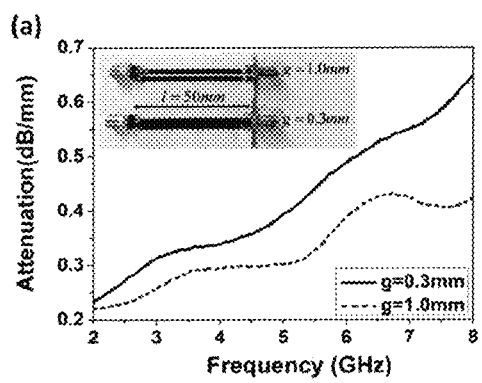
FIG. 2(a) shows attenuation of the transmission lines, and the insert is two transmission line samples with different line gaps, g=0.3 mm and g=0.5 mm, respectively.

The performance of a TL is mainly determined by material and structural parameters such as material losses, dielectric constant of substrate material, line gaps, signal line thickness and etc. Referring to FIG. 2(a), it shows two samples of TLs with different gaps between the lines. As it can be seen, a SMA connector is connected at each port of the line using conductive epoxy. The length of the lines is l=50 mm, and the gaps are g=0.3 mm and g=1 mm, respectively.

Figure 2B:
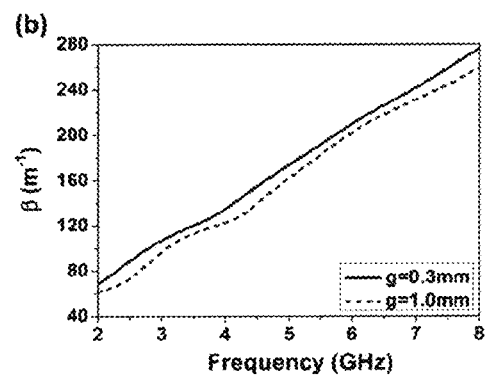
FIG. 2(b) shows phase constants β of the transmission lines.
Figures 3A, 3B, 3C, 3D:
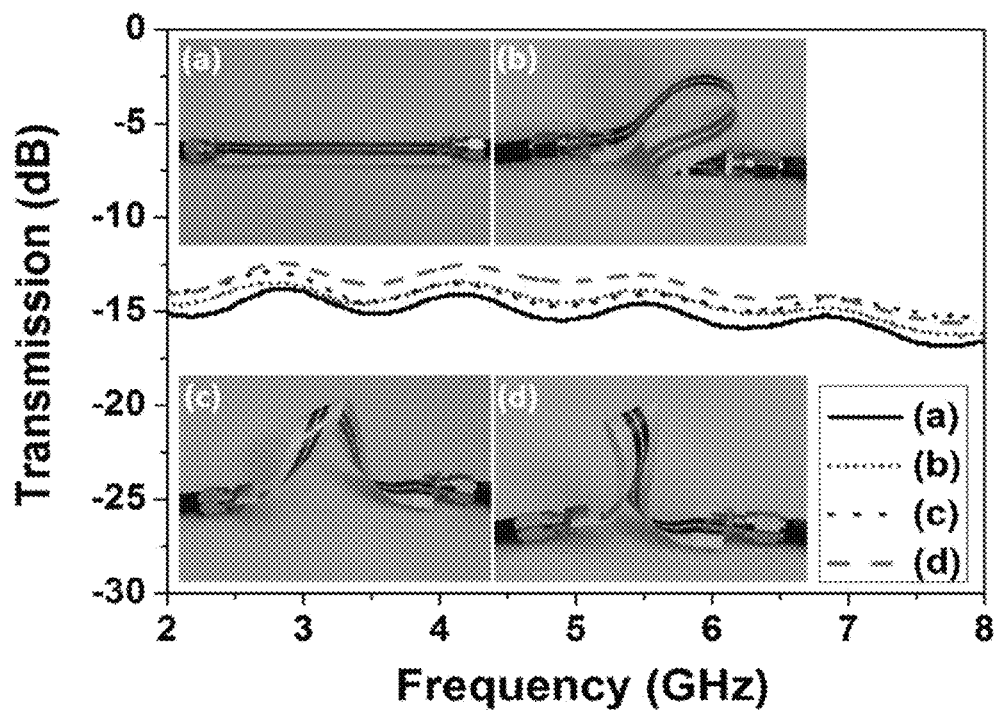
FIGS. 3(a) to 3(d) are schematic views illustrating un-bended, bended and twisted transmission lines and their transmission performances.

Performances of the transmission lines with various gaps are shown, for example, FIG. 2(a) shows attenuation of the transmission lines, and the insert is two transmission line samples with different line gaps, g=0.3 mm and g=0.5 mm, respectively, and FIG. 2(b) shows phase constants β of the transmission lines.

The attenuation is unitized to per mm and displayed in FIG. 2(a). It can be seen that the bigger the line gap, the lower the attenuation. This is because the electromagnetic field is concentrated mainly at inside edges of the lines; smaller gap makes the field more intensive, thus causes more conductor loss. However, it's worthy to point out that the line gap cannot be set arbitrarily as it determines the characteristic impedance of the TL. As expected, the attenuation increases with frequency. The relatively high attenuation in these TLs is due to the thin thickness of graphene laminate. Thickness of graphene laminate in this report is t=7.7 um with conductivity $\sigma=4.3\times10^4$ S·m$^{-1}$. Its skin depths, from 2 GHz to 8 GHz, are between 27 um to 54 um, which means the graphene laminate thickness is only 14.3% to 28.5% of its skin depth. To reduce attenuation in practical applications, normally conductor thickness should be 3-5 times of its skin depth. Increasing graphene laminate thickness is an effective way to obtain lower attenuation. Besides, from FIG. 2(b), the propagation constant is almost linear with frequency, revealing that there is little phase distortion in graphene laminate TLs, which is favored in practical RF applications.

Moreover, the superior flexibility of the printed TLs made of graphene-based laminate is verified with line of 0.1 m length and 1 mm gap, as shown in FIGS. 3(a) to 3(d). Four cases were examined. The graphene-based laminate TL was not bended in FIG. 3(a), bended in FIG. 3(b) but not twisted, bended and twisted in FIG. 3(c) and FIG. 3(d). It is clearly evident that the bending and twisting of the printed graphene TLs do not alter the transmission coefficients much, highly desirable for wearable applications. The slight differences between the four cases are caused by the mutual coupling between different segments of the TLs. For instance, the un-bended case has less transmission than other three cases because no mutual coupling happens between different parts of the line. TLs in FIG. 3(b) and FIG. 3(c) have less coupling than that in FIG. 3(d), as segments of the line in FIG. 3(d)

are placed spatially closer and more mutual coupling is introduced. Higher transmission can be achieved with better impedance matching. As expected, the transmission coefficients of all cases decrease as frequency increases.

Figures 4A, 4B, 4C, 4D:
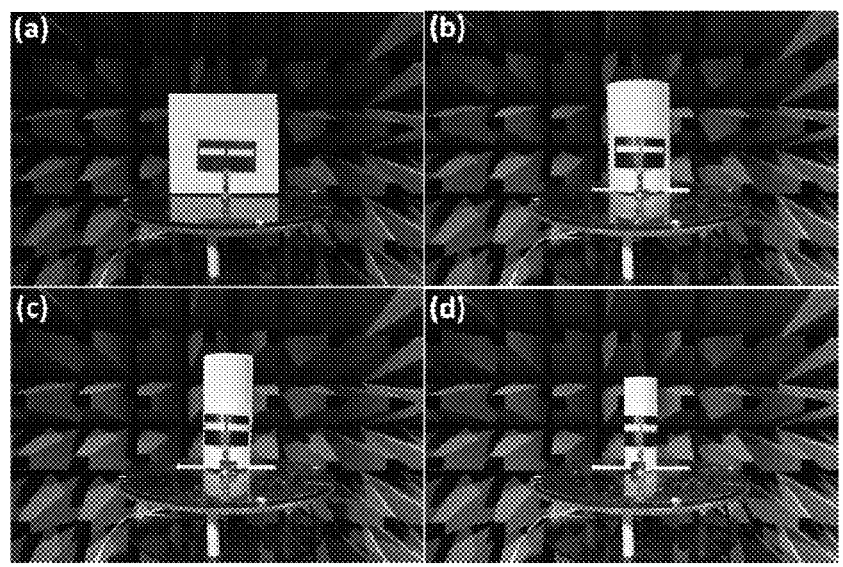

As RF/Microwave antennas are used for on-body wearable communications system, for instance, antenna is used to send and receive RF signals in communications systems. For wearable communications systems, both mechanical flexibility and effective radiation are demanded. For the first time, effective radiation of flexible and wearable printed graphene laminate enabled antenna is experimentally demonstrated in communication frequency bands, such as mobile cellular and WiFi spectrums. For tests of flexibility and conformability, FIGS. 4(a) to 4(d) show the same printed graphene laminate antenna bended and pasted on cylinders of different radii for flexibility and conformability tests. FIG. 4 (a) illustrates the un-bended antenna and FIGS. 4(b), 4(c) and 4(d) show the antenna attached on cylinders with radius of 5.0 cm, 3.5 cm and 2.5 cm, respectively. The antenna is a typical CPW fed slot antenna and printed on paper.

Furthermore, FIG. 5 (a) shows the reflection coefficients of the printed graphene antenna under these four different bending cases measured, and the gain was obtained by three-antenna method. It can be seen that when the antenna is un-bended, the reflection coefficient $S_{11}$ at 1.97 GHz is −18.7 dB, and another peak is at 3.26 GHz with −19.2 dB, revealing good impedance matching. The reflection coefficient is under −8 dB from 1.73 GHz to 3.77 GHz, which covers the bands for Wi-Fi, Bluetooth, WLAN10 (wireless local area network) and mobile cellular communications. The maximum gain is 0.2 dBi at 1.92 GHz and above −1 dBi from 1.82 GHz to 3.72 GHz, demonstrating an effective radiation from the graphene laminate antenna to the free space. With comparison of reflection coefficients corresponding to different bending cases, it can be seen that the reflection coefficients are not sensitive to the bending and do not vary much. The impedance matching points are almost unchanged. However, the change of antenna gain, especially at higher frequency region, which is attributable to that the antenna gain is determined by current distribution on the antenna. When the antenna is bended, the current distribution will be altered, leading to variation on antenna gain performances. Despite that gain at higher frequency band around 3.26 GHz degrades visibly with increasing bending, the gain at lower band around 1.9 GHz to 2.2 GHz has much less variations. This frequency band is where wireless wearable communications systems operate. The experimental data here demonstrate that even when the graphene laminate antenna is bended, the radiation at this frequency band can still be efficient.

Figures 5A, 5B:
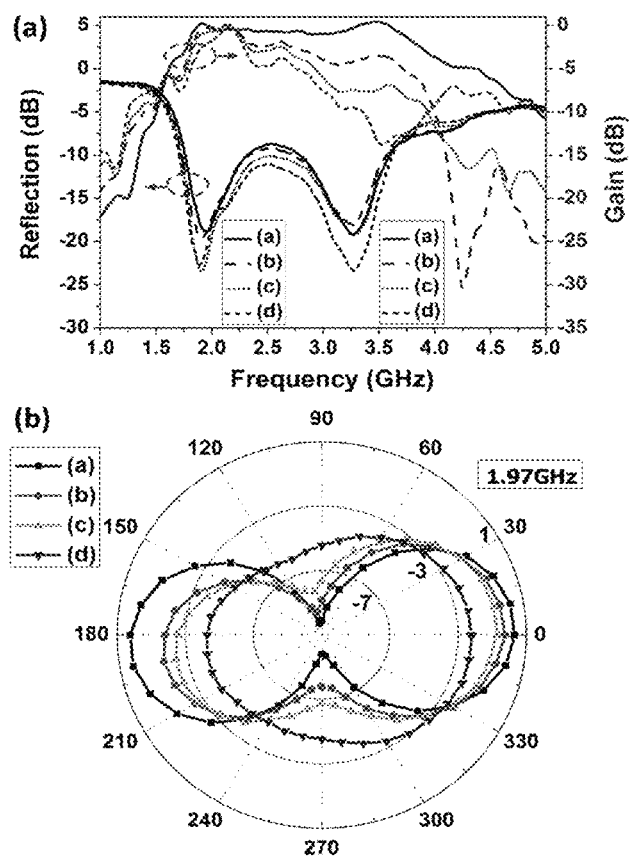

The corresponded radiation patterns under cases FIG. 5(b) at 1.97 GHz in elevation plane were also measured using antenna measurement system (Antenna Measurement Studio 5.5, Diamond Engineering). The data were recorded for every 10 degree rotation. From the radiation patterns, it can be seen that cases FIG. 5(b, curve b) to 5(b, curve c) are quite similar despite of minor decrease of maximum gain. Pattern of case FIG. 5(b, curve d) is rather different from the other three because the much severely bended antenna poses much alteration in current distribution and causes the antenna's resonant frequency to shift.

Figures 6A, 6B:
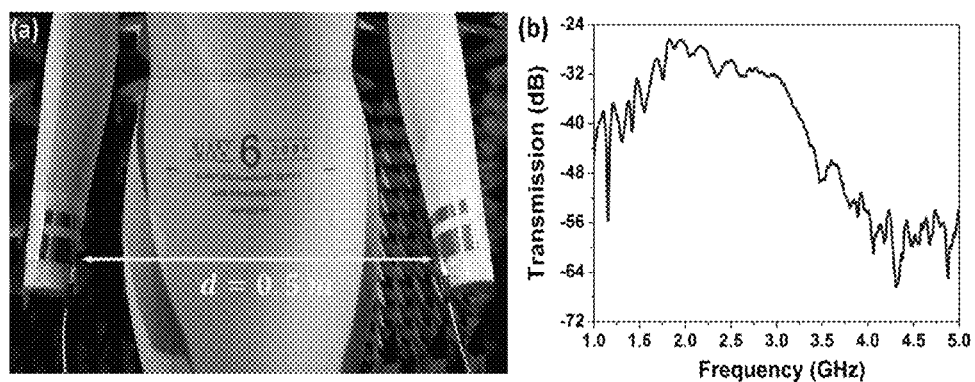

With the aforementioned verification for the flexibility and efficient radiation of the printed graphene laminate enabled antenna, here we go a step further to prove its potentials in wireless wearable communications systems by presenting a real life scenario shown in FIG. 6(a). FIG. 6(a) depicts an on-body communications testing setup. On-body communications is signal transmitting/receiving between on-body networks and systems. In this setup, the graphene antennas are bended and attached on mannequin's hands to transmit/receive RF signals. The transmission coefficient between the two antennas is shown in FIG. 6(b). When the distance between the two antennas is d=0.5 m, the transmission coefficient from 1.67 GHz to 2.87 GHz is above −32 dB, which is more than 20 dB higher than −55 dB observed out of band above 3.8 GHz. The measured results verifying that RF signal can be effectively radiated and received by these two graphene antennas.

Accordingly, we have prepared highly conductive graphene laminate using graphene nanoflakes. The fabrication process is simple and low cost and thus suitable for commercial mass production. The low-temperature processing makes it compatible with heat-sensitive materials like papers and textiles. Combined with other profound advantages in lightweight, mechanical flexibility and environmental friendliness, printed graphene laminate can be ideal for low cost consumable wearable electronics.

Experiments have been conducted to investigate the potential applications of printed graphene-based laminate in constructing RF passive components for wireless wearable communications systems. The feasibility of using printed graphene laminate to transmit/receive RF signals through wires and radiate/receive them wirelessly has been demonstrated by examining basic RF components such as TLs and antennas. The superior flexibility of TLs and antennas made of the printed graphene-based laminate has been fully verified with measurements under different bending and twisting cases. Furthermore, an on-body signal transmission on mannequin has been presented by using graphene-based antennas conformed to the model' arms for radiating and receiving RF signals wirelessly. It is clearly evident that the sound mechanical flexibility and effective radiation of antennas made of the printed graphene-based laminate have successfully facilitated the on-body communications. Summing up with these results, for the first time, it is unambiguously proved that printed graphene based laminate can bring transformative change to the formation of RF passive components such as TLs and antennas. An all graphene-based communications system printed on clothes or other wearables can be expected in the near future.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A method of making a printed graphene-based laminate for wireless wearable communications comprising steps of:
   A). coating a binder-free graphene-based conductive ink on a substrate by printing;
   B). drying the binder-free graphene-based conductive ink in an oven at 60° C. to 200° C. to form a porous layer on a surface of the substrate; and
   C). compressing the porous layer by a compression roller at a compression ratio of 50% to 90% to obtain a dense and high conductive graphene-based laminate for an antenna of wireless wearable communications.

2. The method of making the printed graphene-based laminate as claimed in claim 1, wherein the printing includes but is not limited to screen printing, inkjet printing, and spray printing.

3. The method of making the printed graphene-based laminate as claimed in claim 1, wherein the binder-free graphene-based conductive ink consists of graphene, filler particles, dispersants, and solvents.

4. The method of making the printed graphene-based laminate as claimed in claim 3, wherein the filler particles are selected from a group consisting of carbon materials, metal particles, and conductive oxide powders.

5. The method of making the printed graphene-based laminate as claimed in claim 4, wherein the carbon materials are selected from a group consisting of graphene, graphite, carbon black, carbon nanotube, and fullerene.

6. The method of making the printed graphene-based laminate as claimed in claim 4, wherein the metal particles are selected from a group consisting of platinum, gold, palladium, silver, copper, nickel, zinc, and their core-shell particles as well as alloys.

7. The method of making the printed graphene-based laminate as claimed in claim 4, wherein the conductive oxide powders are selected from a group consisting of palladium oxide and ruthenium oxide.

8. The method of making the printed graphene-based laminate as claimed in claim 1, wherein the porous layer is made from a mixture of macro-porous architecture, in pore diameters of greater than 50 nm, constructed by naturally stacking graphene.

9. The method of making the printed graphene-based laminate as claimed in claim 8, wherein the same porous layer is also constructed by other carbon materials selected from a group consisting of graphite nanoflake, graphite nanosheet, graphite nanoplatelet, carbon nanotube, carbon nanowire, carbon nanorod, and carbon nanofiber.

* * * * *